(12) United States Patent
Hwang et al.

(10) Patent No.: US 9,589,947 B2
(45) Date of Patent: Mar. 7, 2017

(54) SEMICONDUCTOR PACKAGES AND METHODS OF MANUFACTURING THE SAME

(71) Applicant: Samsung Electronics Co., Ltd., Suwon-si, Gyeonggi-do (KR)

(72) Inventors: Jihwan Hwang, Asan-si (KR); Young Kun Jee, Suwon-si (KR); Jung-Hwan Kim, Bucheon-si (KR); Tae Hong Min, Gumi-si (KR); Kwang-chul Choi, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/566,685

(22) Filed: Dec. 10, 2014

(65) Prior Publication Data

US 2015/0093857 A1    Apr. 2, 2015

Related U.S. Application Data

(62) Division of application No. 13/462,518, filed on May 2, 2012, now abandoned.

(30) Foreign Application Priority Data

May 2, 2011    (KR) .......................... 10-2011-0041683

(51) Int. Cl.
*H01L 25/00*    (2006.01)
*H01L 25/18*    (2006.01)
(Continued)

(52) U.S. Cl.
CPC .............. *H01L 25/50* (2013.01); *H01L 21/56* (2013.01); *H01L 21/563* (2013.01);
(Continued)

(58) Field of Classification Search
CPC ... H01L 21/56; H01L 21/563; H01L 21/6835; H01L 21/6836;
(Continued)

(56) References Cited

U.S. PATENT DOCUMENTS 6,762,488 B2 *  7/2004  Maeda .................. H01L 21/568
                                                        257/686
7,948,095 B2 *  5/2011  Ng ........................ H01L 21/486
                                                        257/686
(Continued)

FOREIGN PATENT DOCUMENTS

JP    2005167093 A    6/2005
JP    2007073826 A    3/2007
(Continued)

*Primary Examiner* — Fernando L Toledo
*Assistant Examiner* — Christine L Hagan
(74) *Attorney, Agent, or Firm* — Renaissance IP Law Group LLP

(57) ABSTRACT

Provided are semiconductor devices and methods of manufacturing the same. The semiconductor package includes a substrate, a first semiconductor chip mounted on the circuit substrate and having a first width, a second semiconductor chip overlying the first semiconductor chip and having a second width greater than the first width, and a first under filler disposed between the first and second semiconductor chips, covering a side surface of the first semiconductor chip and having an inclined side surface.

16 Claims, 14 Drawing Sheets

(51) Int. Cl.
    *H01L 21/56* (2006.01)
    *H01L 23/00* (2006.01)
    *H01L 25/065* (2006.01)
    *H01L 21/683* (2006.01)
    *H01L 23/31* (2006.01)

(52) U.S. Cl.
    CPC ...... *H01L 21/6835* (2013.01); *H01L 23/3185* (2013.01); *H01L 24/97* (2013.01); *H01L 25/0657* (2013.01); *H01L 25/18* (2013.01); H01L 2221/68327 (2013.01); H01L 2224/16145 (2013.01); H01L 2224/16225 (2013.01); H01L 2224/32145 (2013.01); H01L 2224/73204 (2013.01); H01L 2225/06513 (2013.01); H01L 2225/06517 (2013.01); H01L 2225/06541 (2013.01); H01L 2225/06555 (2013.01); H01L 2225/06582 (2013.01); H01L 2924/1431 (2013.01); H01L 2924/1434 (2013.01)

(58) Field of Classification Search
    CPC . H01L 2221/68327; H01L 2221/68331; H01L 23/3185; H01L 23/3192; H01L 2021/6006; H01L 21/568
    See application file for complete search history.

(56) References Cited

U.S. PATENT DOCUMENTS

| | | | | |
|---|---|---|---|---|
| 8,105,915 B2* | 1/2012 | Camacho | ............. | H01L 21/561 257/777 |
| 8,461,690 B2* | 6/2013 | Yoshida | ............... | H01L 21/561 257/686 |
| 8,647,924 B2* | 2/2014 | Toh | ....................... | H01L 21/561 257/E21.499 |
| 8,736,076 B2* | 5/2014 | Hawk | .................... | H01L 24/19 257/777 |
| 8,803,334 B2* | 8/2014 | Choi | ...................... | H01L 25/03 257/686 |
| 2004/0145040 A1 | 7/2004 | Fukuda et al. | | |
| 2005/0151228 A1 | 7/2005 | Tanida et al. | | |
| 2007/0007639 A1 | 1/2007 | Fukazawa | | |
| 2008/0036082 A1* | 2/2008 | Eun | ................... | H01L 21/76898 257/737 |
| 2008/0083978 A1 | 4/2008 | Hayashi et al. | | |
| 2010/0224977 A1 | 9/2010 | Kim | | |
| 2010/0261311 A1* | 10/2010 | Tsuji | .................... | H01L 21/561 438/109 |
| 2011/0062592 A1* | 3/2011 | Lee | ....................... | H01L 21/561 257/774 |
| 2011/0115070 A1* | 5/2011 | Lim | ...................... | H01L 21/563 257/698 |
| 2011/0147945 A1* | 6/2011 | Yoshida | ................ | H01L 21/561 257/774 |
| 2011/0285007 A1* | 11/2011 | Chi | ..................... | H01L 21/4846 257/686 |

FOREIGN PATENT DOCUMENTS

| | | |
|---|---|---|
| JP | 2010251347 A | 11/2010 |
| KR | 20060135517 A | 12/2006 |
| KR | 20100002859 A | 1/2010 |
| KR | 20100099573 A | 9/2010 |
| KR | 20110016026 | 2/2011 |

\* cited by examiner

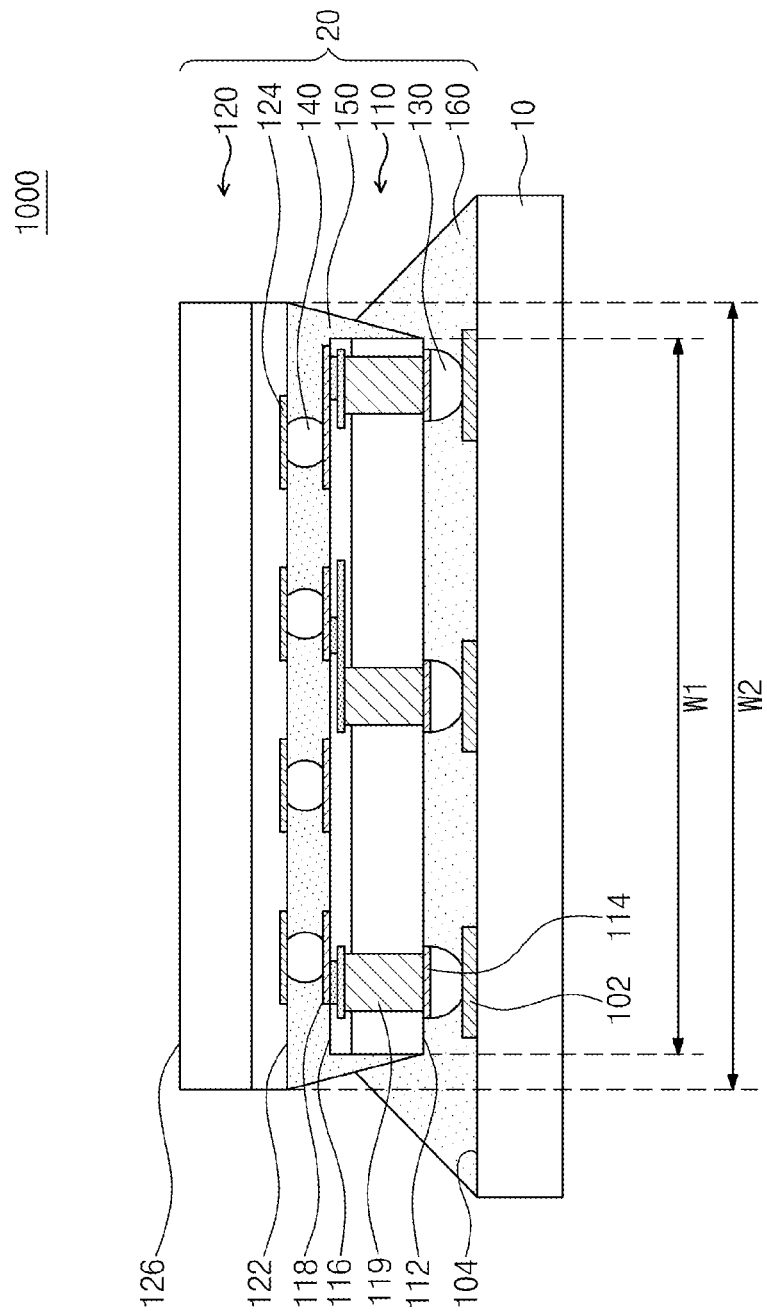

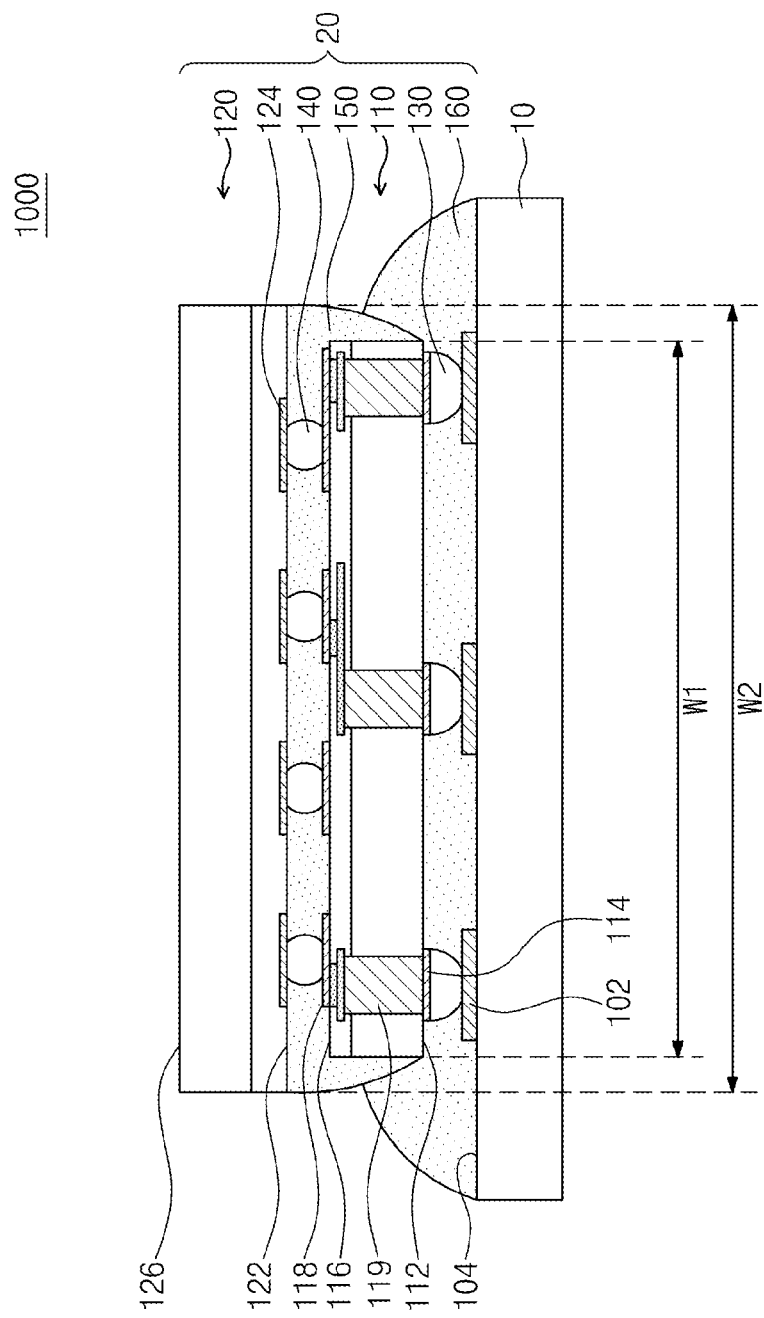

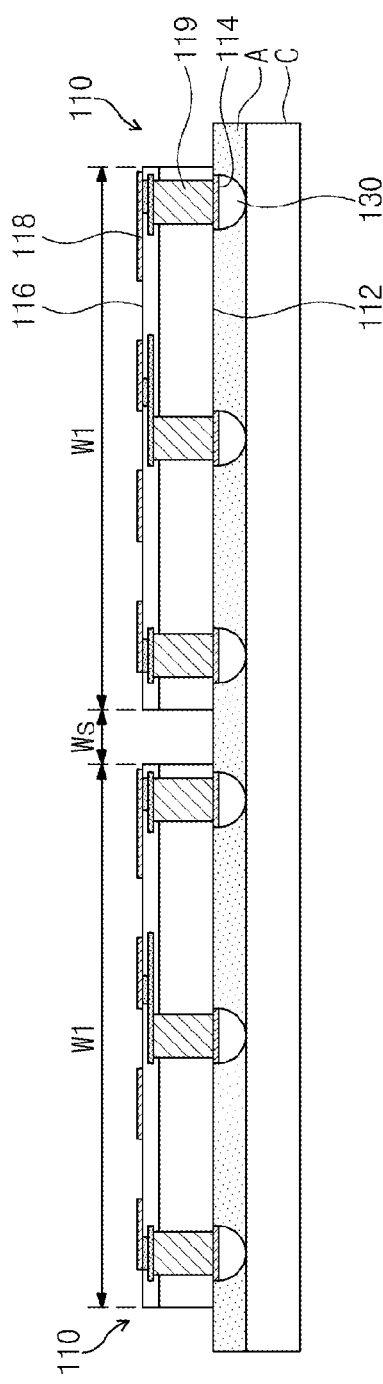
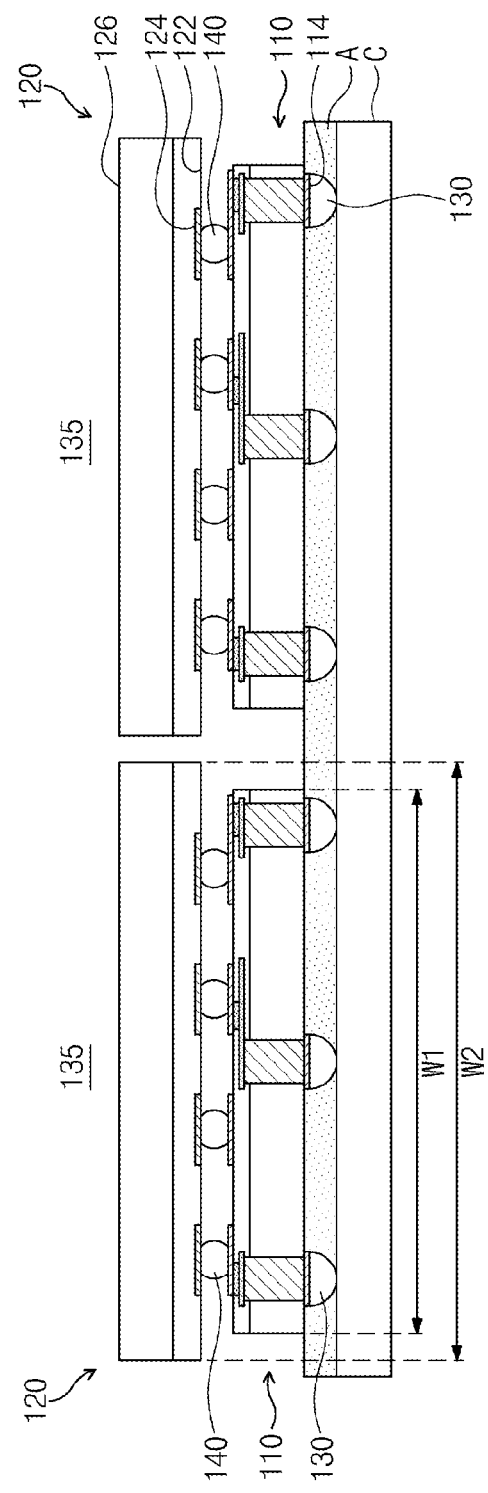
Fig. 2A
Fig. 2B

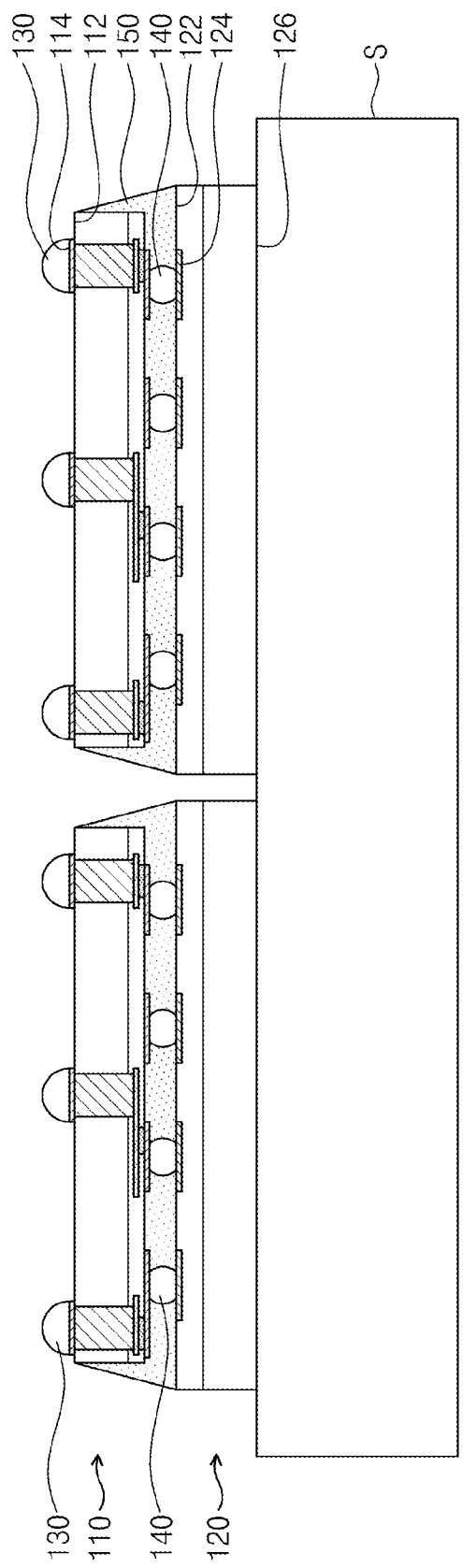

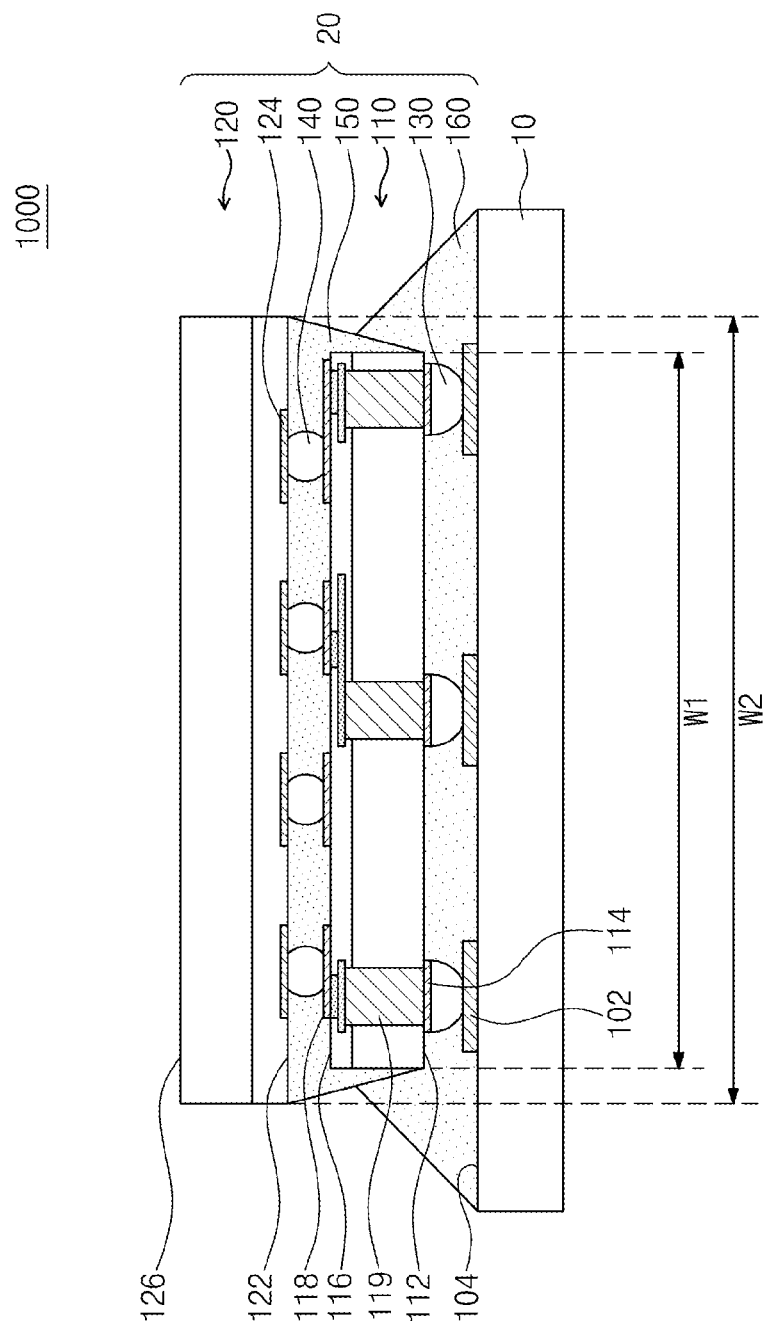

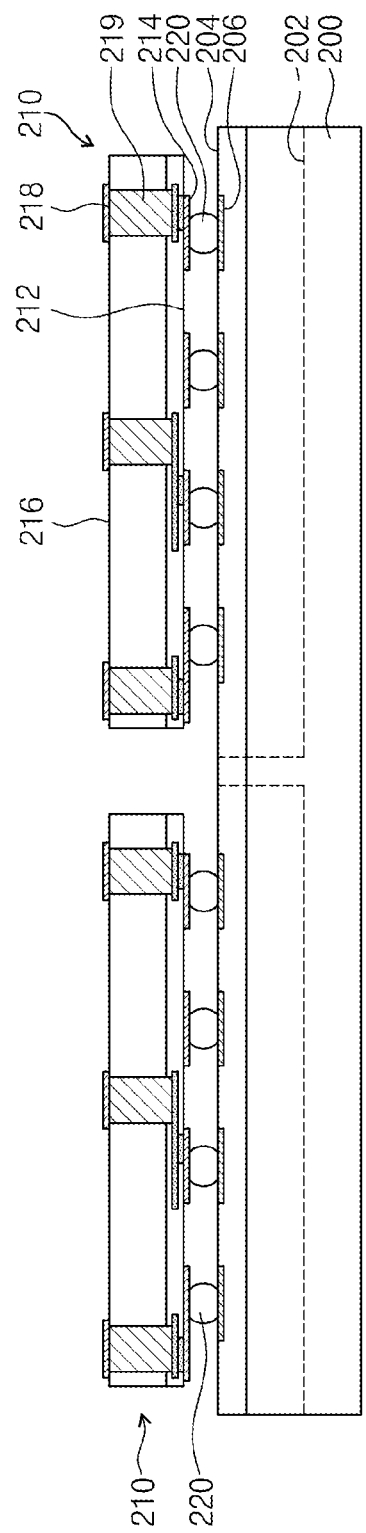

SEMICONDUCTOR PACKAGES AND METHODS OF MANUFACTURING THE SAME

CROSS-REFERENCE TO RELATED APPLICATIONS

This U.S. non-provisional patent application is a divisional of U.S. patent application Ser. No. 13/462,518, filed May 2, 2012 which application claims priority under 35 U.S.C. §119 to Korean Patent Application No. 10-2011-0041683, filed on May 2, 2011, the entirety of which is incorporated by reference herein.

BACKGROUND

The present disclosure herein relates to semiconductor packages and methods of manufacturing the same and, more particularly, to a semiconductor package including a multilayer semiconductor chips and method of manufacturing the same.

As mobile electronic devices become more miniaturized and/or data storage needs of the mobile electronic devices increase substantially, a need for a multi-chip semiconductor package, in which multiple semiconductor chips are mounted or stacked, also increases. Widths of the semiconductor chips vertically stacked may be the same as or different from each other. In particular, when a width of an upper semiconductor chip in the semiconductor chips vertically stacked may be greater than a width of a lower semiconductor chip under the upper semiconductor chip, it may be difficult to stack the semiconductor chips.

SUMMARY

Embodiments of the inventive concept may provide semiconductor packages including stacked semiconductor chips having widths different from each other.

Embodiments of the inventive concept may also provide methods of manufacturing semiconductor packages including stacked semiconductor chips having widths different from each other.

According to example embodiments of the inventive concepts, a semiconductor device may include a substrate; a first semiconductor chip mounted on the circuit substrate, and having a first width; a second semiconductor chip overlying the first semiconductor chip, and having a second width greater than the first width; and a first under filler disposed between the first and second semiconductor chips, covering a side surface of the first semiconductor chip, and having an inclined side surface.

In some embodiments, the semiconductor package may further include a second under filler filling a space between the circuit substrate and the first semiconductor chip, and having an inclined side surface.

In other embodiments, the second under filler may partially cover the first under filler at least partially covering the side surface of the first semiconductor chip.

In still other embodiments, an inclination of the side surface of the first under filler may be opposite to an inclination of the side surface of the second under filler.

In yet other embodiments, the semiconductor package may further include at least one first connection terminal electrically interconnecting the circuit substrate and the first semiconductor chip; and at least one second connection terminal interconnecting the first semiconductor chip and the second semiconductor chip.

According to example embodiments of the inventive concepts, a method of fabricating a semiconductor device may include mounting a plurality of first semiconductor chips having first widths and being separated from each other on a carrier substrate; stacking each of a plurality of second semiconductor chips having second widths greater than the first width on a respective one of the plurality of first semiconductor chips; separating the carrier substrate from the stacked first and second semiconductor chips; filling a space between the first and second semiconductor chips with a first under filler; and mounting the stacked first and second semiconductor chips on a circuit substrate.

In some embodiments, a distance between adjacent ones of the first semiconductor chips may be greater than a difference between the first width and the second width.

In other embodiments, sticking the first semiconductor chips on the carrier substrate may include: forming a temporary adhesive on the carrier substrate; forming first connection terminals on each of the first semiconductor chips; and disposing the first semiconductor chips on the carrier substrate to bring the first connection terminals into contact with the temporary adhesive.

In still other embodiments, separating the carrier substrate from the stacked first and second semiconductor chips may include: disposing the stacked first and second semiconductor chips on a work stage to bring top surfaces of the second semiconductor chips into contact with the work stage; and performing a physical or chemical treatment to the carrier substrate having the temporary adhesive to separate the temporary adhesive and the carrier substrate from the stacked first and second semiconductor chips.

In yet other embodiments, the first under filler may fill the space between the first and second semiconductor chips with the stacked first and second semiconductor disposed on the work stage, so that a portion of the first under filler adjacent to each of the second semiconductor chips may have a width greater than a width of another portion of the first under filler closer to the first semiconductor chips.

In yet still other embodiments, the method may further include filling a space between the circuit substrate and the first semiconductor chip with a second under filler.

In further embodiments, a portion of the second under filler adjacent to the circuit substrate may have a width greater than a width of another portion of the second under filler closer to the first semiconductor chip.

According to example embodiments of the inventive concepts, a method of fabricating a semiconductor device may include: stacking second semiconductor chips on a substrate where first semiconductor chips are formed; filling a space between the substrate and each of the second semiconductor chips with a first under filler; cutting the substrate to separate the first semiconductor chips, on which the second semiconductor chips are respectively stacked, from each other; and mounting the stacked first and second semiconductor chips on a circuit substrate.

In some embodiments, the stacked first and second semiconductor chips may be mounted on the circuit substrate to dispose the second semiconductor chip between the circuit substrate and the first semiconductor chip. In this case, the method may further include filling a space between the circuit substrate and the second semiconductor chip with a second under filler.

In other embodiments, each of the first semiconductor chips may be a memory chip, and each of the second semiconductor chips may be a logic chip.

BRIEF DESCRIPTION OF THE DRAWINGS

The inventive concept will become more apparent in view of the attached drawings and accompanying detailed description.

FIG. 1A is a cross sectional view illustrating a semiconductor package according to an embodiment of the inventive concept;

FIG. 1B is a cross sectional view illustrating a semiconductor package according to another embodiment of the inventive concept;

FIGS. 2A through 2E are cross sectional views illustrating a method of manufacturing a semiconductor package according to an embodiment of the inventive concept;

FIGS. 3A through 3F are cross sectional views illustrating a method of manufacturing a semiconductor package according to another embodiment of the inventive concept;

DETAILED DESCRIPTION OF THE EMBODIMENTS

Figure 2C:
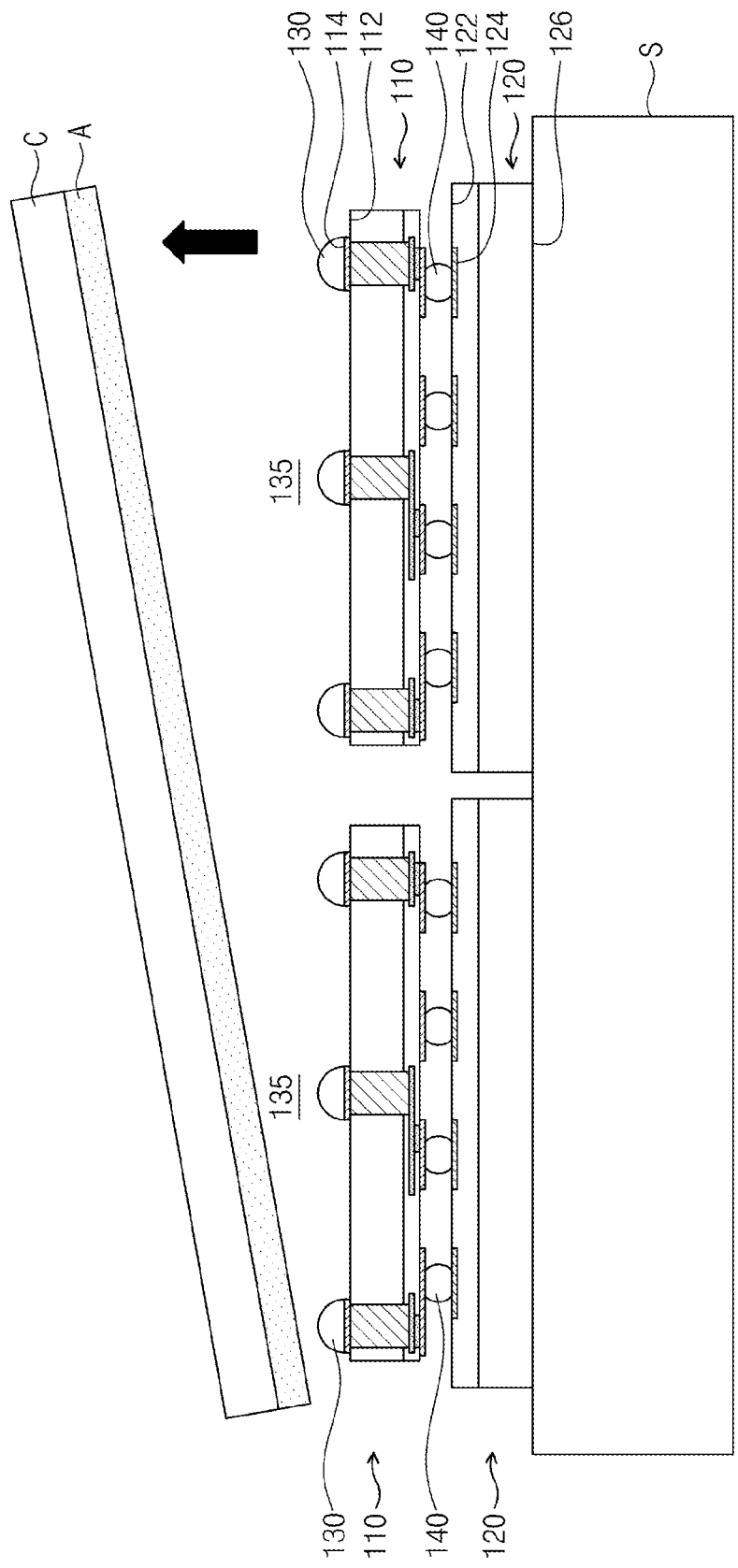

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIG. 1A is a cross sectional view illustrating a semiconductor package according to an embodiment of the inventive concept.

Referring to FIG. 1A, a semiconductor package 1000 may include a substrate 10 such as a circuit substrate and a semiconductor chip structure 20.

The circuit substrate 10 may be a printed circuit board (PCB). In an embodiment, the semiconductor chip structure 20 may be mounted on a certain surface 104 of the circuit substrate 10.

First contact pads 102, which are electrically connected to the semiconductor chip structure 20, may be disposed on the certain surface 104 of the circuit substrate 10. The first contact pads 102 may also be electrically connected to circuits or electrical connections in the circuit substrate 10. Since the semiconductor chip structure 20 may be mounted on the circuit substrate 10, the circuit substrate 10 may have a width substantially greater than the width of the semiconductor chip structure 20.

The semiconductor chip structure 20 may include a plurality of semiconductor chips being vertically stacked. For the sake of simplicity, the stacked semiconductor chip structure 20 including a first semiconductor chip 110 and a second semiconductor chip 120 will be described hereinafter as an exemplary embodiment. However, the inventive concept is not limited thereto.

The semiconductor chip structure 20 may include the first semiconductor chip 110, first connection terminals 130, the second semiconductor chip 120, second connection terminals 140, a first under filler 150 and a second under filler 160.

The first semiconductor chip 110 may be separated from the certain surface 104 of the circuit substrate 10. In an embodiment, a first surface 112 of the first semiconductor chip 110 may face the certain surface 104 of the circuit substrate 10 and be separated or spaced apart from the certain surface 104.

Second contact pads 114, which are electrically connected to the circuit substrate 10, may be disposed on the first surface 112 of the first semiconductor chip 110. The first contact pads 102 may be electrically connected to the second contact pads 114 through the first connection terminals 130, respectively. Each of the first connection terminals 130 may have a ball structure or a bump structure. For example, each of the first connection terminals 130 may be a solder ball.

A distance between the circuit substrate 10 and the first semiconductor chip 110 may be substantially the same as the sum of a thickness of the first pad 102, a thickness of the second pad 114, and a thickness of the first connection pattern 130 between the first and second contact pads 102 and 114.

The first semiconductor chip 110 may further include a second surface 116 opposite to the first surface 112. Third contact pads 118, which are electrically connected to the second semiconductor chip 120, may be disposed on the second surface 116 of the first semiconductor chip 110. The second contact pads 114 may be electrically connected to the third contact pads 118 via through-electrodes or through silicon vias 119. The through-electrodes 119 may substantially penetrate through the first semiconductor chip 110.

According to some embodiments of the inventive concept, the first semiconductor chip 110 may have a first width W1. The first width W1 may be substantially smaller than the width of the circuit substrate 10.

The second semiconductor chip 120 may be separated from the first semiconductor chip 110. In an embodiment, a third surface 122 of the second semiconductor chip 120 may face the second surface 116 of the first semiconductor chip 110, and be separated from the second surface 116 of the first semiconductor chip 110.

Fourth contact pads 124, which are electrically connected to the first semiconductor chip 110, may be disposed on the third surface 122. The third contact pads 118 may be electrically connected to the fourth contact pads 124 through the second connection terminals 140, respectively. Each of the second connection terminals 140 may have a ball structure or a bump structure. For example, each of the second connection terminals 140 may be a solder ball. A size of the second connection terminals 140 may be substantially smaller than a size of the first connection terminals 130.

A distance between the first and second semiconductor chips 110 and 120 may be substantially the same as the sum of a thickness of the third contact pad 118, a thickness of the fourth contact pad 124, and a thickness of the second connection pattern 140 between the third and fourth contact pads 118 and 124.

The second semiconductor chip 120 may further include a fourth surface 126 opposite to the third surface 122.

According to some embodiments, the second semiconductor chip 120 may have a second width W2 greater than the first width W1. The second width W2 may be substantially smaller than the width of the circuit substrate 10.

The first under filler 150 may fill a space or be disposed between the first and second semiconductor chips 110 and 120. In more detail, the first under filler 150 may be formed to cover the second connection terminals 140. Also, the first under filler 150 may cover the second surface 116 of the first semiconductor chip 110, the third surface 122 of the second semiconductor chip 120 and a side surface of the first semiconductor chip 110.

According to some embodiments of the inventive concept, a portion of the first under filler 150 adjacent to the second semiconductor chip 120 may have a width greater than a width at another portion of the first under filler 150 near the first semiconductor chip 110. In other words, the width W2 of the upper portion of the first under filler 150 may be substantially wider than the width W1 of the lower portion of the first under filler 150. A side surface of the first under filler 150 may be inclined at a steady slope from the top toward the base thereof as shown in FIG. 1A. Also, the side surface of the first under filler 150 may be inclined as convex shaped as shown in FIG. 1B, or concave shaped, otherwise tapered or stair-stepped (not shown) from the top toward the base thereof. The second under filler 160 may fill a space or be disposed between the first semiconductor chip 110 and the circuit substrate 10. In more detail, the second under filler 160 may be formed to cover the first connection terminals 130. In an embodiment, the second under filler 160 may cover the side surface of the first semiconductor chip 110 and the certain surface 104 of the circuit substrate 10. Also, the second under filler 160 may at least partially cover the first under filler 150 disposed on the side surface of the first semiconductor chip 110.

In one embodiment, a portion of the second under filler 160 adjacent to the circuit substrate 10 may have a width greater than a width of another portion of the second under filler 160 nearer the first semiconductor chip 110. In other words, the width of the upper portion of the second under filler 160 may be substantially narrower than the width of the lower portion of the second filler 160. The side surface of the second under filler 160 may be inclined at a steady slope (FIG. 1A), concave or convex shaped (FIG. 1B), or otherwise tapered or stair-stepped from the base toward the top thereof. The inclination of the side surface of the first under filler 150 may be opposite to the inclination of the side surface of the second under filler 160.

FIGS. 2A to 2E are cross sectional views illustrating a method of manufacturing a semiconductor package according to an embodiment of the inventive concept.

Referring to FIG. 2A, first semiconductor chips 110, to which first connection terminals 130 are attached, may be mounted on a carrier substrate C. The first semiconductor chips 110 may be laterally separated or spaced apart from each other.

Each of the first semiconductor chips 110 may include second contact pads 114 on a first surface 112, third contact pads 118 on second surface 116 opposite to the first surface 112, and through-electrodes or through silicon vias 119 electrically connecting the second and third contact pads 114 and 118. Also, each of the first semiconductor chips 110 may have a first width W1. The first connection terminals 130 may be electrically in contact with the second contact pads 114 of the semiconductor chips 110, respectively.

A temporary adhesive A may be formed on a top surface of the carrier substrate C. The first semiconductor chips 110, to which the first connection terminals 130 are attached, may be mounted or separated from the carrier substrate C by performing a physical or chemical treatment to the temporary adhesive A. For example, the physical or chemical treatment may be performed using heat, ultraviolet rays, static electricity, and/or a chemical material.

The first semiconductor chips 110 may be disposed on the carrier substrate C to bring the first connection terminals 130 into contact with the temporary adhesive A. In an embodiment, a distance Ws between the first semiconductor chips 110 may be substantially equal to or greater than difference between a width of the first semiconductor chip 110 and a width of second semiconductor chip 120, which will be described later.

Referring to FIG. 2B, second semiconductor chips 120, to which second connection terminals 140 are attached, may be respectively mounted on the first semiconductor chips 110 to form stack structures 135.

Each of the second semiconductor chips 120 may include fourth contact pads 124 on a third surface 122. Also, each of the second semiconductor chips 120 may further a fourth surface 126 opposite to the third surface 122.

In an embodiment, each of the second semiconductor chips 120 may have a second width W2 substantially greater than the first width W1. The second connection terminals 140 may be electrically in contact with the fourth contact pads 124, respectively.

Since the distance (Ws illustrated in FIG. 2A) between adjacent first semiconductor chips 110 may be substantially greater than the difference between the widths W1 and W2 of the first and second semiconductor chips 110 and 120, the second semiconductor chips 120, having widths that are greater than the first semiconductor chips 110 can be easily mounted on the first semiconductor chips 110, respectively.

Referring to FIG. 2C, the carrier substrate C may be separated from the stack structures 135.

In an embodiment, the second semiconductor chips 120 may be disposed on a work stage S to bring the fourth surfaces 126 of the second semiconductor chips 120 into contact with the work stage S. The physical or chemical treatment may be performed to the carrier substrate C on which the temporary adhesive A is formed, so that the carrier substrate C and the temporary adhesive A may be separated from the stack structures 135.

Referring to FIG. 2D, a space between the first and second semiconductor chips 110 and 120 may be filled with a first under filler 150 according to some embodiments. In one embodiment, the first under filler 150 may fill the space between the first and second semiconductor chips 110 and 120 when the fourth surface 126 of the second semiconductor chip 120 is in contact with the work stage S. Additionally, the first under filler 150 may cover a side surface of the first semiconductor chip 110. Depending on the application, the first under filler 150 may cover a portion or an entire side surface of the first semiconductor chip 110.

A portion of the first under filler 150 adjacent to each of the second semiconductor chips 120 may have a width greater than a width at another portion of the first under filler 150 nearer the first semiconductor chips 110. The width of the upper portion of the first under filler 150 may be substantially wider than the width of the lower portion of the first filler 150. The first under filler 150 may have an inclined side surface as described in connection with FIG. 1

Referring to FIG. 2E, the stack structure 135 (as illustrated in FIG. 2C) may be mounted on a substrate such as a circuit substrate 10.

The circuit substrate 10 may include first contact pads 102 being electrically connected to the first connection terminals 130. The first semiconductor chip 110 may be electrically connected to the circuit substrate 10 through the first connection terminals 130. Thus, a semiconductor chip structure 20 may be mounted on the circuit substrate 10.

A second under filler 160 may fill a space between the circuit substrate 10 and the first semiconductor chip 110 according to some embodiments. Additionally, the second under filler 160 may partially cover the first under filler 150 being formed on the side surface of the first semiconductor chip 110.

A portion of the second under filler 160 adjacent to the circuit substrate 10 may have a width greater than a width of another portion of the second under filler 160 closer to the first semiconductor chip 110. The width of the upper portion of the second under filler 160 may be substantially narrower than the width of the lower portion of the second filler 160. Also, the second under filler 160 may have an inclined side surface as discussed in connection with FIG. 1.

Therefore, the semiconductor chip structure 20 including the first and second semiconductor chips 110 and 120, the first and second connection terminals 130 and 140, and the first and second under fillers 150 and 160 may be mounted on the circuit substrate 10.

As described above, since the first semiconductor chips 110 may be disposed on the carrier substrate C to be laterally separated or spaced apart from each other by the distance greater than the difference between the widths of the first and second semiconductor chips 110 and 120, the second semiconductor chips 120 substantially greater than the first semiconductor chips 110 may be easily mounted on the first semiconductor chips 110.

FIGS. 3A to 3F are cross sectional views illustrating a method of manufacturing a semiconductor package according to another embodiment of the inventive concept.

Referring to FIG. 3A, first connection terminals 220 may be formed on a substrate 200 where first semiconductor chips 202 are formed, and second semiconductor chips 210 may be mounted on the substrate 200.

The first semiconductor chips 202 may be formed at the substrate 200, and first contact pads 206 electrically connected to the first semiconductor chips 202 may be formed on a first surface 204 of the substrate 200. The first surface 204 of the substrate 200 may include first surfaces of the first semiconductor chips 202. The first connection terminals 220 may be electrically in contact with the first contact pads 206. For example, each of the first semiconductor chips 202 may be a memory chip.

Each of the second semiconductor chips 210 may include a second surface 212 and a third surface 216 opposite to each other. Second contact pads 214 being electrically in contact with the first connection terminals 220 may be formed on the second surface 212 of the second semiconductor chips 210, and third contact pads 218 may be formed on the third surface 216. The second contact pads 214 may be electrically connected to the third contact pads 218 through through-electrodes 219 penetrating each of the second semiconductor chips 210. For example, each of the second semiconductor chips 210 may be a logic chip or microprocessor chips.

Figure 3B:
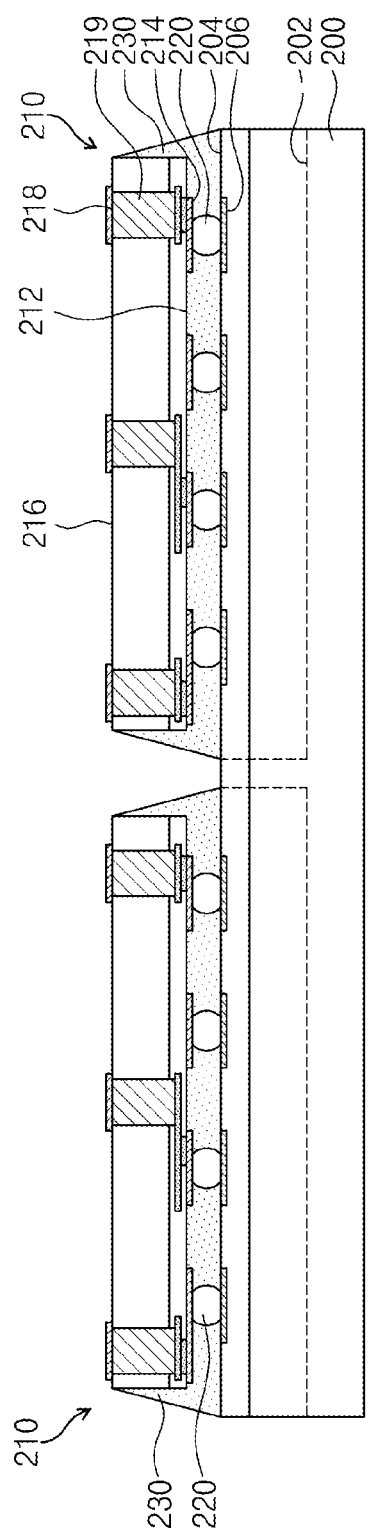

Referring to FIG. 3B, a first under filler 230 may be formed to fill a space between each of the second semiconductor chips 210 and the substrate 200 according to some embodiments. That is, the first under filler 230 may fill a space between the second semiconductor chip 210 and the first semiconductor chip 202 formed at the substrate 200.

Additionally, the first under filler 230 may cover a side surface of the second semiconductor chips 210.

A portion of the first under filler 230 adjacent to the substrate 200 may have a width greater than a width of another portion of the first under filler 230 closer to the second semiconductor chips 210. The width of the upper portion of the first under filler 150 may be substantially wider than the width of the lower portion of the first filler 150. Also, the first under filler 230 may have an inclined side surface as discussed in connection with FIG. 1A.

Figure 3C:
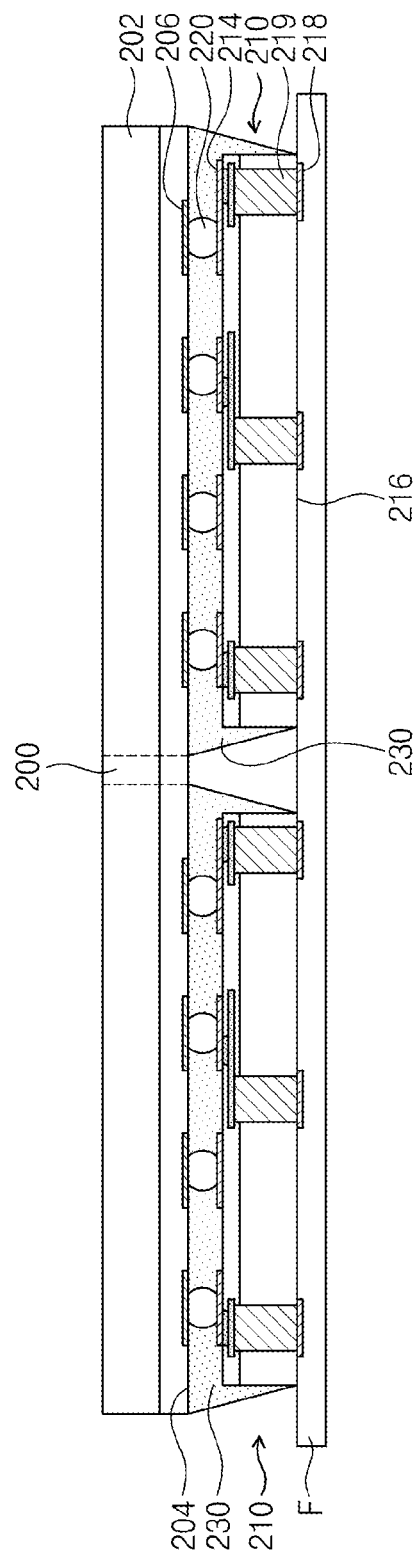

Referring to FIG. 3C, a backside surface of the substrate 200 opposite to the first surface 204 may be grinded.

In more detail, after the third surface 216 of the second semiconductor chip 210 may be masked by a protection member F such as a protection film, the backside surface of the substrate 200 opposite to the first surface 204 may be grinded. After grinding the backside surface of the substrate 200, the protection member F may be removed.

Figure 3D:
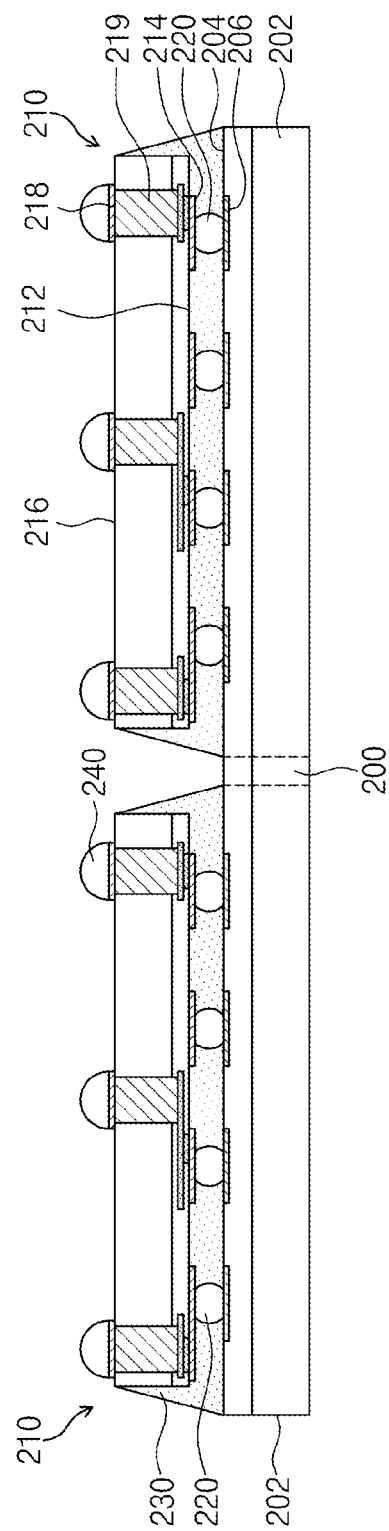

Referring to FIG. 3D, second connection terminals 240 may be formed on the third contact pads 218 on the third surface 216 of the second semiconductor chip 210.

Figure 3E:
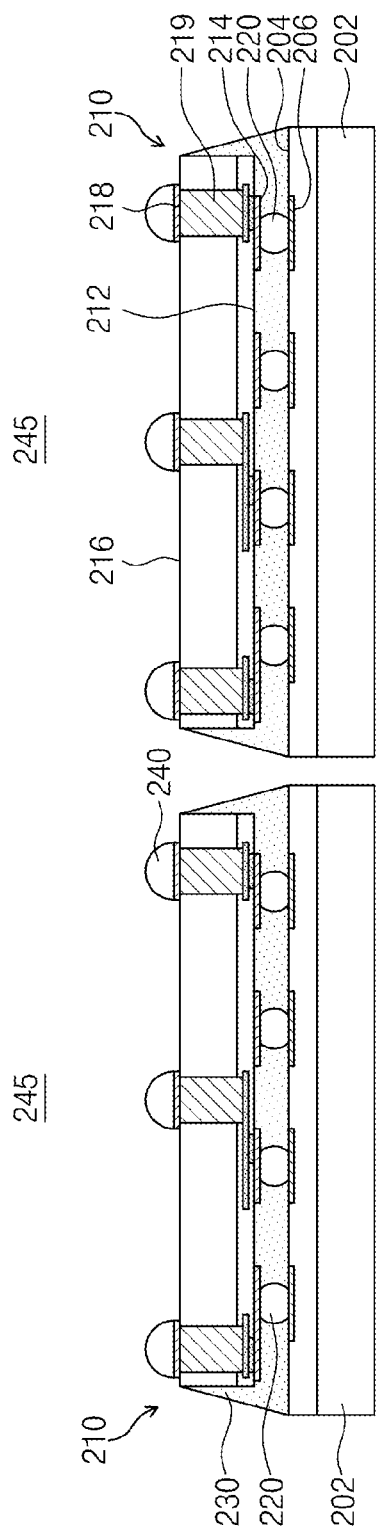

Referring to FIG. 3E, the substrate 200, where the first semiconductor chips 202 are formed, may be cut to form stack structures 245. Each of the stack structures 245 may include the first and second semiconductor chips 202 and 210.

In more detail, each of the stack structures 245 may include the first semiconductor chip 202, the second semiconductor chip 210 mounted on the first semiconductor chip 202, the first connection terminals 220 interconnecting the first and second semiconductor chips 202 and 210, the second connection terminals 240 electrically coupled with the second semiconductor chip 210, and the first under filler 230 filling the space between the first and second semiconductor chips 202 and 210.

Figure 3F:
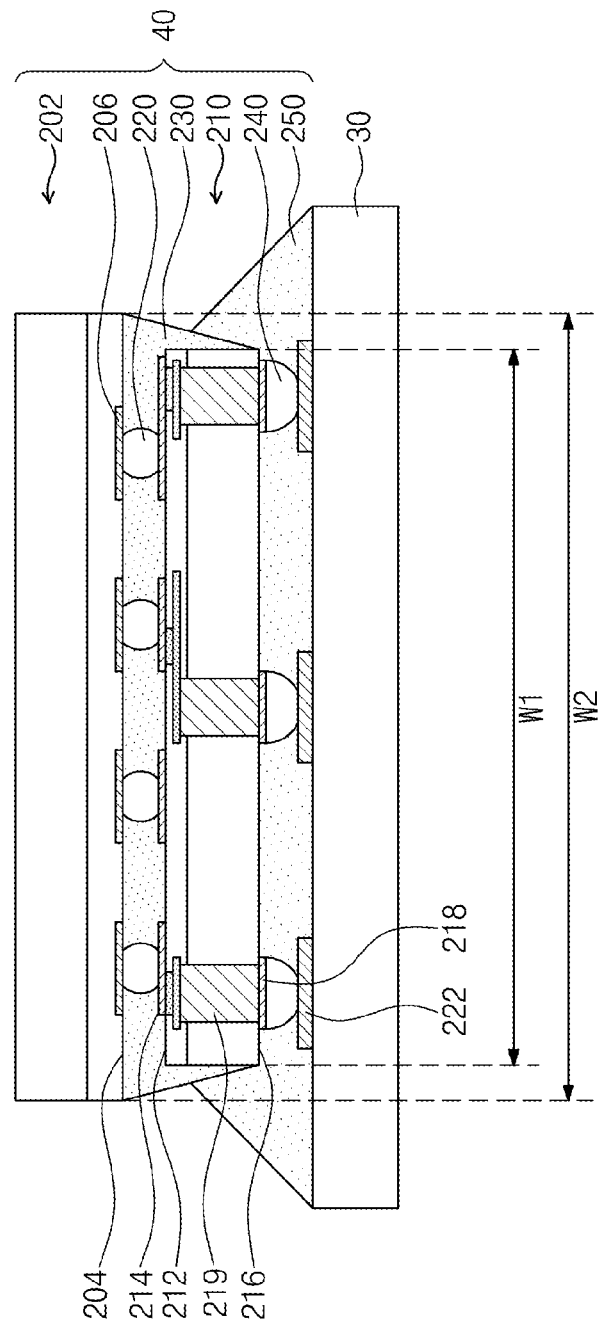

Referring to FIG. 3F, the stack structure 245 may be mounted on a substrate such as a circuit substrate 30, e.g., PCB.

The circuit substrate 30 may include fourth contact pads 222, and the second connection terminals 240 may be electrically in contact with the fourth contact pads 240.

A space between the second semiconductor chip 210 and the circuit substrate 30 may be filled with a second under filler 250. Additionally, the second under filler 250 may at least partially cover the first under filler 230 being formed on the side surface of the second semiconductor chip 210.

A portion of the second under filler 250 adjacent to the circuit substrate 30 may have a width greater than a width of another portion of the second under filler 250 closer to the second semiconductor chip 210. The width of the upper portion of the second under filler 160 may be substantially narrower than the width of the lower portion of the second filler 160. Also, the second under filler 250 may have an inclined side surface as discussed in connection with FIG. 1.

Thus, a semiconductor chip structure 40, which includes the first and second semiconductor chips 202 and 210, the first and second connection terminals 220 and 240, and the first and second under fillers 230 and 250, may be mounted on the circuit substrate 30.

As described above, after the second semiconductor chips 210 having relatively small widths may be mounted on the substrate 200 where the first semiconductor chips 202 having relatively great widths are formed, and then the first semiconductor chips 202 may be separated from each other. As a result, semiconductor chips having widths different from each other may be easily stacked. Also, when the first semiconductor chip 202 may be a memory chip and the second semiconductor chip 210 may be a logic chip, semiconductor chips having functions different from each other may be easily stacked.

Figure 4A:
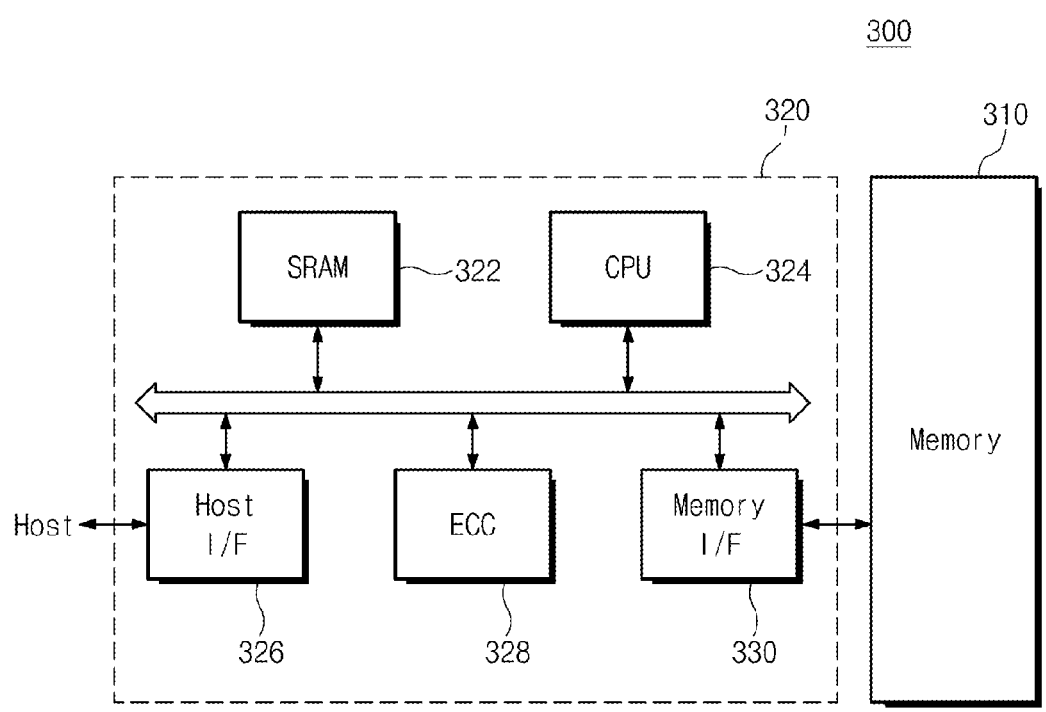
FIG. 4A is a block diagram illustrating a memory card including a semiconductor package according to some embodiments of the inventive concept.

FIG. 4A is a block diagram illustrating a memory card including a semiconductor package according to some embodiments of the inventive concept.

Referring to FIG. 4A, semiconductor package according to some embodiments of the inventive concept may be applied to a memory card 300. For example, the memory card 300 may include a memory controller 320 to control a data exchange between a host and a memory 310. A static random access memory (SRAM) 322 may be used as an operation memory of a central processing unit (CPU) 324. A host interface 326 may include data exchange protocol of the host connected to the memory card 300. An error correction code (ECC) 328 may detect and correct at least one error that may be included in data read from the memory 310. A memory interface 330 may interface with the memory 310. The central processing unit 324 performs various control operations for the data exchange of the memory controller 320.

Because the memory 310 in the memory card 300 is formed using the semiconductor package according to some embodiments of the inventive concept, the memory 310 may include stacked semiconductor chips having widths different form each other. As a result, the memory 310 may include mass storage devices.

Figure 4B:
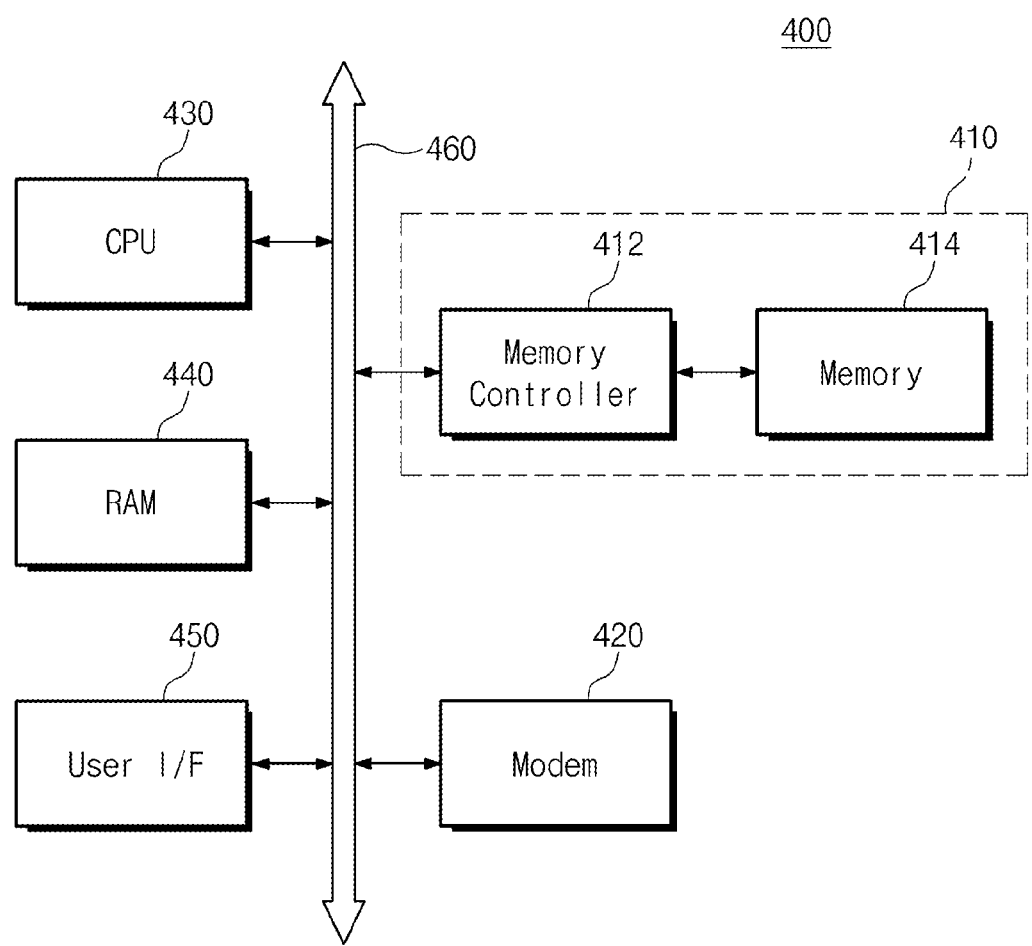
FIG. 4B is a block diagram illustrating an information processing system including a semiconductor package according to some embodiments of the inventive concept.

FIG. 4B is a block diagram illustrating an information processing system including a semiconductor package according to some embodiments of the inventive concept.

Referring to FIG. 4B, an information processing system 400 may include a memory system 410 including the semiconductor package according to some embodiments of the inventive concept. The information processing system 400 may include a mobile device or a computer. For example, the information processing system 400 may include the memory system 410, and a modem 420, a central processing unit 430, a random access memory (RAM) 440 and a user interface 450 that are electrically connected to a system bus 460. The memory system 410 may store data processed by the central processing unit 430 or data received from the outside.

The memory system 410 may include a memory controller 412 and a memory 414. The memory system 410 may be constituted to be the same with the memory card 300 described with reference to FIG. 4A. The information processing system 400 may be provided to a memory card, a solid state disk (SSD), a camera image sensor and/or an application chipset. For example, the memory system 410 may be constituted by the solid state disk (SSD). In this case, the information processing system 400 may stably and reliably store mass data in the memory system 410.

According to some embodiments of the inventive concept, semiconductor chips, which have widths different from each other and/or functions different from each other, may be easily stacked without a failure and/or with reducing a failure, thereby manufacturing a semiconductor package.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:
1. A method of manufacturing a semiconductor package, comprising:
    mounting a plurality of first semiconductor chips having first widths and being separated from each other on a carrier substrate;

stacking each of a plurality of second semiconductor chips having second widths greater than the first widths on a respective one of the plurality of first semiconductor chips;

separating the carrier substrate from the stacked first and second semiconductor chips;

filling a space between the first and second semiconductor chips with a first under filler after separating the carrier substrate from the stacked first and second semiconductor chips; and mounting the stacked first and second semiconductor chips on a circuit substrate.

2. The method of claim 1, wherein a distance between adjacent ones of the first semiconductor chips is greater than a difference between the first width and the second width.

3. The method of claim 1, wherein mounting the first semiconductor chips on the carrier substrate comprises:

forming a temporary adhesive on the carrier substrate;

forming first connection terminals on each of the first semiconductor chips; and disposing the first semiconductor chips on the carrier substrate to bring the first connection terminals into contact with the temporary adhesive.

4. The method of claim 3, wherein separating the carrier substrate from the stacked first and second semiconductor chips comprises:

disposing the stacked first and second semiconductor chips on a work stage to bring top surfaces of the second semiconductor chips into contact with the work stage; and separating the temporary adhesive and the carrier substrate from the stacked first and second semiconductor chips.

5. The method of claim 4, wherein separating the temporary adhesive and the carrier substrate is performed by a physical or chemical treatment to the carrier substrate.

6. The method of claim 4, wherein the first under filler fills the space between the first and second semiconductor chips with the stacked first and second semiconductor disposed on the work stage, so that a portion of the first under filler adjacent to each of the second semiconductor chips has a width greater than a width of another portion of the first under filler closer to the first semiconductor chips.

7. The method of claim 1, further comprising:

filling a space between the circuit substrate and the first semiconductor chip with a second under filler.

8. The method of claim 7, wherein a portion of the second under filler adjacent to the circuit substrate has a width greater than a width of another portion of the second under filler closer to the first semiconductor chip.

9. A method of manufacturing a semiconductor package, comprising:

mounting a plurality of first semiconductor chips having first widths and being separated from each other on a carrier substrate;

stacking each of a plurality of second semiconductor chips having second widths greater than the first widths on a respective one of the plurality of first semiconductor chips;

inverting the carrier substrate and the stacked first and second semiconductor chips;

separating the carrier substrate from the stacked first and second semiconductor chips after inverting the carrier substrate and the stacked first and second semiconductor chips on the carrier substrate;

filling a space between the first and second semiconductor chips with a first under filler after separating the carrier substrate from the stacked first and second semiconductor chips; and inverting the stacked first and second semiconductor chips after filling the space between the first and second semiconductor chips with the first under filler; and mounting the stacked first and second semiconductor chips on a circuit substrate after inverting the stacked first and second semiconductor chips.

10. The method of claim 9, wherein a distance between adjacent ones of the first semiconductor chips is greater than a difference between the first width and the second width.

11. The method of claim 9, wherein mounting the first semiconductor chips on the carrier substrate comprises:

forming a temporary adhesive on the carrier substrate;

forming first connection terminals on each of the first semiconductor chips; and disposing the first semiconductor chips on the carrier substrate to bring the first connection terminals into contact with the temporary adhesive.

12. The method of claim 11, wherein separating the carrier substrate from the stacked first and second semiconductor chips comprises:

disposing the stacked first and second semiconductor chips on a work stage to bring top surfaces of the second semiconductor chips into contact with the work stage; and separating the temporary adhesive and the carrier substrate from the stacked first and second semiconductor chips.

13. The method of claim 12, wherein separating the temporary adhesive and the carrier substrate is performed by a physical or chemical treatment to the carrier substrate.

14. The method of claim 12, wherein the first under filler fills the space between the first and second semiconductor chips with the stacked first and second semiconductor disposed on the work stage, so that a portion of the first under filler adjacent to each of the second semiconductor chips has a width greater than a width of another portion of the first under filler closer to the first semiconductor chips.

15. The method of claim 9, further comprising:

filling a space between the circuit substrate and the first semiconductor chip with a second under filler.

16. The method of claim 15, wherein a portion of the second under filler adjacent to the circuit substrate has a width greater than a width of another portion of the second under filler closer to the first semiconductor chip.

* * * * *